(12) United States Patent  
Kozlowski et al.

(10) Patent No.: US 7,009,647 B1  
(45) Date of Patent: Mar. 7, 2006

(54) CMOS IMAGER HAVING A JFET ADAPTED TO DETECT PHOTONS AND PRODUCE AN AMPLIFIED ELECTRICAL SIGNAL

(75) Inventors: Lester J. Kozlowski, Simi Valley, CA (US); Frank Chang, Los Angeles, CA (US); Wu-Jing Ho, Cupertino, CA (US)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 09/557,454

(22) Filed: Apr. 24, 2000

(51) Int. Cl.  
*H04N 3/14* (2006.01)  
*H04N 5/335* (2006.01)  
*H01L 29/80* (2006.01)  
*H01L 31/0288* (2006.01)  
*H01L 31/112* (2006.01)

(52) U.S. Cl. .................... 348/294; 348/308; 257/257

(58) Field of Classification Search ............ 348/294, 348/301–308; 257/257, 258, 262, 290, 291, 257/292  
See application file for complete search history.

(56) References Cited

U.S. PATENT DOCUMENTS

| | | | | |
|---|---|---|---|---|
| 3,721,839 A | * | 3/1973 | Shannon | 327/515 |
| 4,814,836 A | * | 3/1989 | Thompson | 257/187 |
| 5,124,596 A | * | 6/1992 | Wurcer | 327/429 |
| 5,528,059 A | * | 6/1996 | Isogai | 257/187 |
| 5,563,429 A | * | 10/1996 | Isogai | 257/258 |
| 5,618,688 A | * | 4/1997 | Reuss et al. | 438/189 |
| 5,712,498 A | * | 1/1998 | Reich et al. | 257/256 |
| 5,847,381 A | * | 12/1998 | Isogai | 250/208.1 |
| 6,046,466 A | * | 4/2000 | Ishida et al. | 257/258 |
| 6,130,423 A | * | 10/2000 | Brehmer et al. | 250/208.1 |
| 6,221,687 B1 | * | 4/2001 | Abramovich | 438/70 |

OTHER PUBLICATIONS

*CMOS: Circuit Design, Layout, and Simulation*; R. Jacob Baker, Harry W. Li and David E. Boyce, 1998, Chpt. 2-4.  
*Integrated Circuit Manufacturability, The Art of Process and Design Integration*, Dhiraj K. Pradhan, 1999, Chpt. 4-5.

* cited by examiner

*Primary Examiner*—Thai Tran  
*Assistant Examiner*—Kelly Jerabek  
(74) *Attorney, Agent, or Firm*—Farjami & Farjami LLP

(57) ABSTRACT

A photodetector is formed in a CMOS circuit using a junction field-effect transistor (JFET). The JFET/CMOS photodetector can be used to create an active pixel sensor for a CMOS digital imager, performing both photodetection and electrical signal amplification, allowing higher fill factors than with conventional APS imagers. A standard CMOS fabrication process is augmented with a small number of steps to integrate the JFET within the pixel, allowing the use of conventional CMOS fabrication plants.

9 Claims, 10 Drawing Sheets a) Amplified Pixel Cross-Section

Figure 2 — Prior Art

Pixel = Detector + Amplifier + Switch

Figure 5
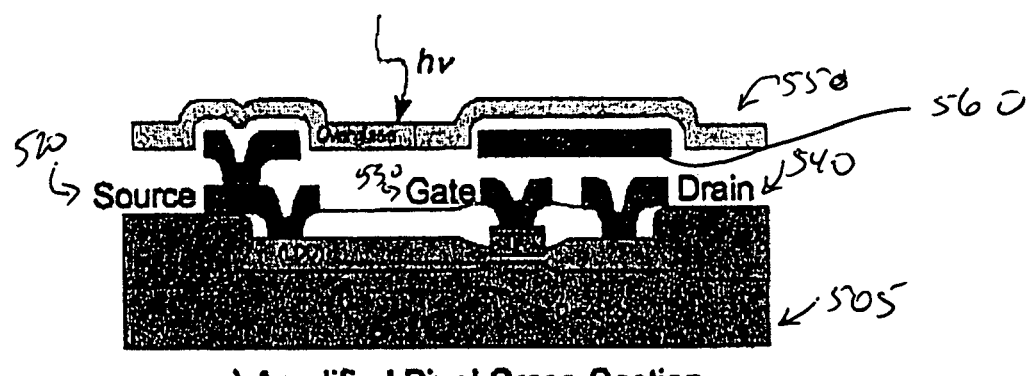
a) Amplified Pixel Cross-Section

CMOS IMAGER HAVING A JFET ADAPTED TO DETECT PHOTONS AND PRODUCE AN AMPLIFIED ELECTRICAL SIGNAL

BACKGROUND

1. Field of the Invention

The present invention relates to digital imaging systems using CMOS photodetectors and more particularly to JFET/CMOS imagers.

2. Description of the Related Art

CMOS Imaging

CMOS (Complementary Metal Oxide Semiconductor) image sensors are specialized integrated circuits (ICs) that act as the "eye" of digital still or video cameras, as well as other electronic equipment. CMOS image sensors detect and convert incident light (photons)—first into electronic charge (electrons) and, ultimately, into digital bits. The sensor core typically consists of an array of photodiodes which detect visible light. CMOS transistors co-located in each picture element (pixel) select, amplify and transfer the photodiode signals. A CMOS imager or imaging system typically includes the sensor core and various ancillary circuits which dynamically amplify the signal depending on lighting conditions, suppress noise, process the detected image and translate the digitized data into an optimum format.

CMOS Developments

Developments in CMOS image sensor technology are paving the way for a new generation of digital imaging products with broad consumer applicability. According to research studies conducted by Intel Corporation, consumers' first preference for a computer peripheral is a digital camera. Digital camera sales are continuing to boom as high quality, full-featured products become affordable for a broad base of consumers. With the ability to provide instantly viewable and easily insertable images into computer-generated documents, the rise in the popularity of the Internet as a communications medium, and most importantly, the elimination of the cost and time of film processing, digital cameras are poised to replace traditional film cameras for many consumer applications.

The total available market for digital imaging, including industrial and security cameras, automotive sensors, PC videocams, scanners, digital still cameras and digital camcorders, is forecasted to grow from about 20 million units in 1996 to over 100 million units in 2002. Most digital imaging devices currently use charge coupled device (CCD) image sensors to electronically capture images. A CCD device is a charge-transfer device that collects photocharge in pixels and uses clock pulses to shift the charge along a chain of pixels to a charge-sensitive amplifier. CCDs typically output pixel-by-pixel analog signals. CCDs have been used for about 25 years to provide image sensing in products including video cameras, security cameras and now digital still cameras as well as fax machines and copiers.

CCD technology has been incrementally engineered to provide high quality images with low visible noise (granular distortion visible in the image). However, CCDs are complex and expensive to use in cameras; they usually require three to eight supporting chips (depending on camera features) as well as multiple voltage sources. In addition, CCDs typically begin to exhibit unacceptably high noise levels above a threshold of roughly 1024×768 resolution (the typical resolution of high-end camcorders) at video frame rates (30 frames per second). The high-resolution CCDs used for high-end applications have been cost-prohibitive for consumer products and have been operated at slow rates to minimize their read noise.

CMOS imager technology, on the other hand, can deliver significant system cost savings and can mitigate the performance limitations of the CCD. A fully integrated CMOS solution can be five times lower in cost and ten times lower in power consumption (which leads to longer battery life, better form factors and reduced weight) than a comparable CCD imaging solution.

Applications

CMOS video imagers can be implemented in widely-used consumer products such as camcorders and digital cameras to create images usable by PCs, as well as in toys, security cameras and digital cellular/PCS telephone systems. Business and industrial applications include videoconferencing, machine vision, medical instrumentation, broadcasting and video-based information display or acquisition for real estate, insurance and other business segments.

CMOS still imagers can reduce the cost and power required to provide high quality image sensing for consumer products including still digital cameras, toys, portable communications devices and security equipment. Business and industrial applications include professional photography for publishing, office automation, machine vision and medical instrumentation.

History of CMOS Imaging

MOS fabrication technology has been used since about 1977 to produce imagers. Early camcorders used NMOS(N-channel Metal Oxide Semiconductor) image sensors which were quite competitive with the nascent CCD-based products of the early 1980's. CCDs proved superior for most imagers, however, because of the immaturity of MOS transistor integration. Specialized imagers subsequently migrated to CMOS in about 1984 to facilitate robust operation, radiation hardness and higher performance for space exploration, aerospace and low-volume commercial applications. Ever shrinking circuit geometries coupled with advances in imager design have now enabled the circuit miniaturization needed to produce CMOS imagers at the higher pixel resolutions needed for compact consumer electronics.

CMOS imagers can offer several significant advantages over CCD imagers, including lower overall cost for the imaging system bill of materials (BOM), lower power requirements and a higher level of integration, enabling "camera-on-a-chip" capabilities that can also reduce the size of the imaging system. In addition, CMOS imagers are usually relatively easy to manufacture in a standard CMOS wafer fabrication facility, whereas CCDs can be complex, expensive to produce, and can require a specialized fabrication facility dedicated to CCDs.

With process geometries of 0.5 $\mu$m and below, CMOS imagers can support resolution comparable to that of CCDs. In addition, a single CMOS imager includes anti-blooming and on-chip signal conditioning so objectionable artifacts and noise can be suppressed to very low levels. Blooming is the overflow of signal charge from extremely bright pixels to adjoining pixels that results from oversaturation. Blooming is similar to overexposure in film photography, except that it is manifested in electronic imaging media as vertical or horizontal streaks. Standard CCD cameras, for example, often portray night-time images of cars with two vertical streaks caused by blooming from headlight saturation. Adding saturation-limiting potential barriers and a charge sink adjacent to the pixel can help eliminate blooming. Blooming is not a problem in typical CMOS active pixel sensors because no charge is transferred either within the pixel or pixel-to-pixel.

As process geometries continue to shrink, integration levels continue to increase. CMOS has been positioning itself as the technology of choice for all imaging products. According to industry analysts, CMOS image sensors are expected to gradually replace CCDs in many digital imaging applications and account for nearly 50 percent of digital imagers over the next five years.

Ease of Manufacture

CMOS is used to manufacture approximately 90 percent of all semiconductors today, including most memory devices, microprocessors and application specific integrated circuits (ASICs). Manufacturing imagers using this highly standardized process is typically less costly than producing CCDs, which are usually made using specialized fabrication processes that require dedicated manufacturing equipment. In addition, unlike CMOS, CCDs have not integrated digital logic on the same chip nor supported the level of integration and availability of functional cells.

As a further benefit of the standardized CMOS technology, most semiconductor technology advances occur in CMOS technology, financed by the ongoing efforts of major manufacturers to produce larger memory chips and faster microprocessors. Other devices produced in CMOS will benefit from the ongoing research and investment in new equipment that is required to move to smaller process geometries, which allow more functions to be integrated onto a single chip.

"Camera-on-a Chip" Capability

With CCD imagers, only the image capture and foliation functions have been included on the CCD image sensing device. A handful of supporting semiconductors are usually required to operate the device, condition the image signal, perform post-processing, and generate standard video output. In contrast, CMOS imagers can be made with a "camera-on-a-chip" capability. The fully integrated product can offer five times lower cost and ten times lower power consumption (which leads to longer battery life for portable devices) than a comparable CCD imaging board.

Performance

Resolution and noise are two interrelated parameters that are used to measure performance of a digital image sensor. There are two dimensions of noise: read noise and fixed pattern noise (FPN). Read noise (also known as temporal noise) occurs randomly from time to time and is generated by several basic noise mechanisms of electronic components and looks to observers like the "snow" present on inactive TV channels. FPN, on the other hand, does not change from frame to frame and is somewhat analogous to peering at scenes through a chain-link fence. Depending on its relative magnitude, FPN can be quite objectionable relative to the temporal noise.

CMOS imager technology can readily support future digital imaging devices. Active pixel sensor imagers can offer extremely low read noise at video frame rates because the amplifier at each pixel typically operates at much lower bandwidth than the output amplifier. This basic change can reduce the read noise by at least a factor of 10.

While pixel-based amplification is a key attribute, the fact that each pixel's photo-generated charge is independently converted to a voltage can also be a drawback. Since the amplifiers are not exactly alike from pixel to pixel, the resulting FPN often can limit imaging performance more than temporal noise. A key to successful CMOS imagers has been to integrate the necessary on-chip circuitry to eliminate the fixed pattern noise. Although CMOS readily facilitates such integration, the size of such circuits has presented problems.

Inside a CMOS Imager

CMOS pixel arrays form the core of a CMOS image sensor. CMOS pixel arrays are based on either active or passive pixels. A pixel is an individual picture element. In solid-state imagers, a pixel refers to a discrete photosensitive cell that can collect and hold a photocharge. Photocharge is a phenomenon in which silicon exposed to photons results in the release of charge carriers. A photocurrent results when an electric field sweeps the carriers away. The current that the light generates is directly proportional to the light intensity. A photocharge results when a capacitor collects the charge that the photocurrent carries. The display resulting from the collection of photocharge usually has the same number of pixels as the imager does. Passive pixels typically use a simpler internal structure, which does not amplify the photodiode's signal within each pixel. Active pixels typically include amplification circuitry in each pixel.

The simplest CMOS imaging pixel is a passive pixel, which consists of a photodiode and an access transistor; the photo-generated charge is passively transferred from each pixel to downstream circuits. The charge must, however, be efficiently transferred with low noise and nonuniformity. A Passive Pixel Sensor (PPS)—a CMOS image sensor made with passive pixels—thus shifts the signal processing burden from each pixel to support circuits which read each pixel, convert the charge to a signal voltage, amplify the resulting signal, suppress the temporal noise and cancel the support nonuniformity created by these circuits.

The fraction of real estate within each pixel which detects light is the optical fill factor. A fill factor is the ratio of light-sensitive area to the pixel's total size, also known as aperture efficiency. The fill factor is not 100% because some of the pixel area must be used to transfer the signal to the rest of the imager.

Passive pixel sensors typically have a high fill factor—typically 70 to 80 percent—because the pixel often contains as few as one access transistor. PPS technology has been used for applications requiring a lower-cost image sensor solution, such as transmission of video over standard telephone lines for personal communications and business videoconferencing. The large optical fill factor can maximize signal collection and, hence, minimize fabrication cost by avoiding the need for microlenses. Microlenses—lenses etched directly on the chip's surface for each pixel—are a standard feature of CCDs and many CMOS active pixel sensors. When accurately deposited over each pixel, microlenses concentrate the incoming light into the photo-sensitive region, increasing the effective fill factor. When the as-drawn fill factor is low and microlenses are not used, the light falling elsewhere is either lost or, in some cases, creates artifacts in the images by generating electrical currents in the circuitry.

Active pixel sensors (APS)—CMOS imagers made with active pixels—typically incorporate transistors in each pixel to convert the photo-generated charge to a voltage, amplify the resulting signal and reduce noise. Adding these components typically reduces APS fill factor in 0.6 $\mu$m processes to about 20 to 30 percent. To counter the lower fill factor, APS imagers often use microlenses to capture the light that would otherwise strike the pixel's insensitive area. Microlenses can double or triple the effective fill factor. The lower temporal noise of APS imagers make APS imagers very useful for digital still camera applications.

Many other problems and disadvantages of the prior art will become apparent to one skilled in the art after comparing such prior art with the techniques as described herein.

SUMMARY OF THE INVENTION

Briefly, a complimentary metal oxide semiconductor (CMOS) device such as an imager provides a photosensitive junction field-effect transistor (JFET) formed on a silicon substrate. The JFET detects incident photons through an overglass layer to a photo absorbing layer formed on the surface of the substrate, and produces an electrical signal corresponding to the number of photon detected.

On one embodiment, the JFET/CMOS device has a lower corner frequency than an N-metal oxide semiconductor (NMOS) JFET of the same size. In another embodiment, the JFET/CMOS device has a lower input referred noise than an NMOS JFET of the same size.

A CMOS active pixel sensor (APS) imaging element is made using a JFET/CMOS device capable of detecting photons and producing an electrical signal corresponding to the number of photons detected. In one embodiment, the JFET/CMOS APS imaging element contains a source follower circuit. In another embodiment, the JFET/CMOS APS imaging element contains a source follower with positive feedback and laser trimmability. In a third embodiment, the JFET/CMOS APS imaging element is contained in a differential amplifier.

A digital camera can be implemented using an array of CMOS APS pixels that use a JFET/CMOS device for both photodetection and electrical signal amplification.

A process of fabricating a JFET/CMOS device forms a photosensitive JFET in the CMOS device on a wafer.

BRIEF DESCRIPTION OF THE DRAWINGS

A better understanding of the present invention can be obtained when the following detailed description is considered in conjunction with the following drawings.

FIG. 5 is a cross sectional view of an exemplary JFET/CMOS active pixel;

DETAILED DESCRIPTION OF THE DRAWINGS

Figure 1:
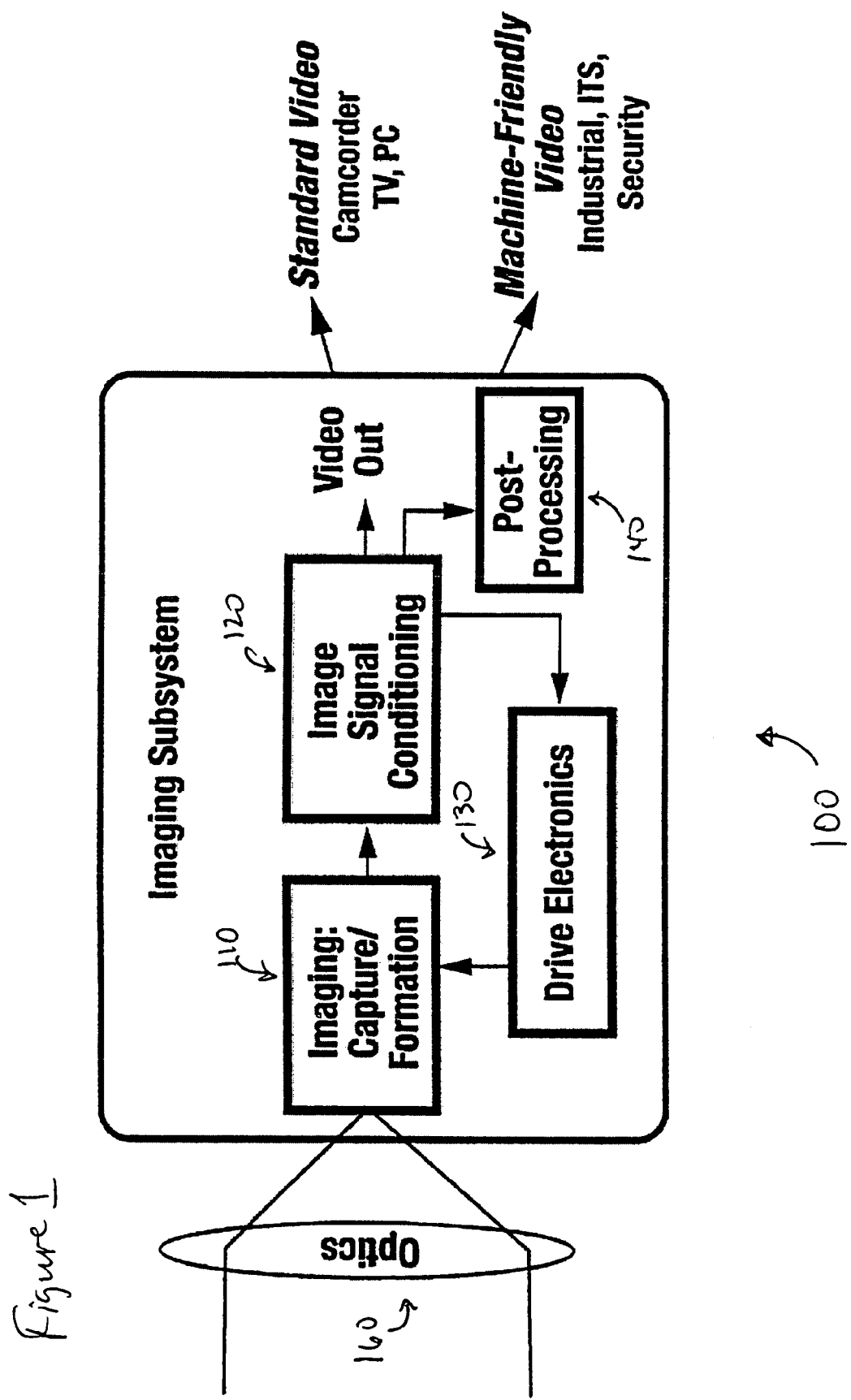
FIG. 1 is a block diagram of an exemplary CMOS imager according to the present invention.

Turning now to FIG. 1, an exemplary digital camera imager 100 is shown. Incident light passes through camera optics 160 onto the imager 100. An imaging capture/formation block 110 detects the incident photons and generates electrical signals based on the detected photons. An image signal conditioning block 120 performs signal conditioning actions such as color correction, gain control, and the like.

The image signal conditioning block 120 can direct a drive electronics block 130 to adjust image capture parameters such as integration time (the time photons are allowed to accumulate before the electrical signals are transmitted to the signal conditioning block 120) for example. The drive electronics block 130 controls the behavior of the capture/formation block 110. Depending on the final output desired, the signal conditioning block 120 may directly generate video output to standard video devices, for example, camcorders, TVs, and PCs. For other output devices, a post-processing block 140 can be used to convert the video signal into a machine-friendly video signal.

Figure 2:
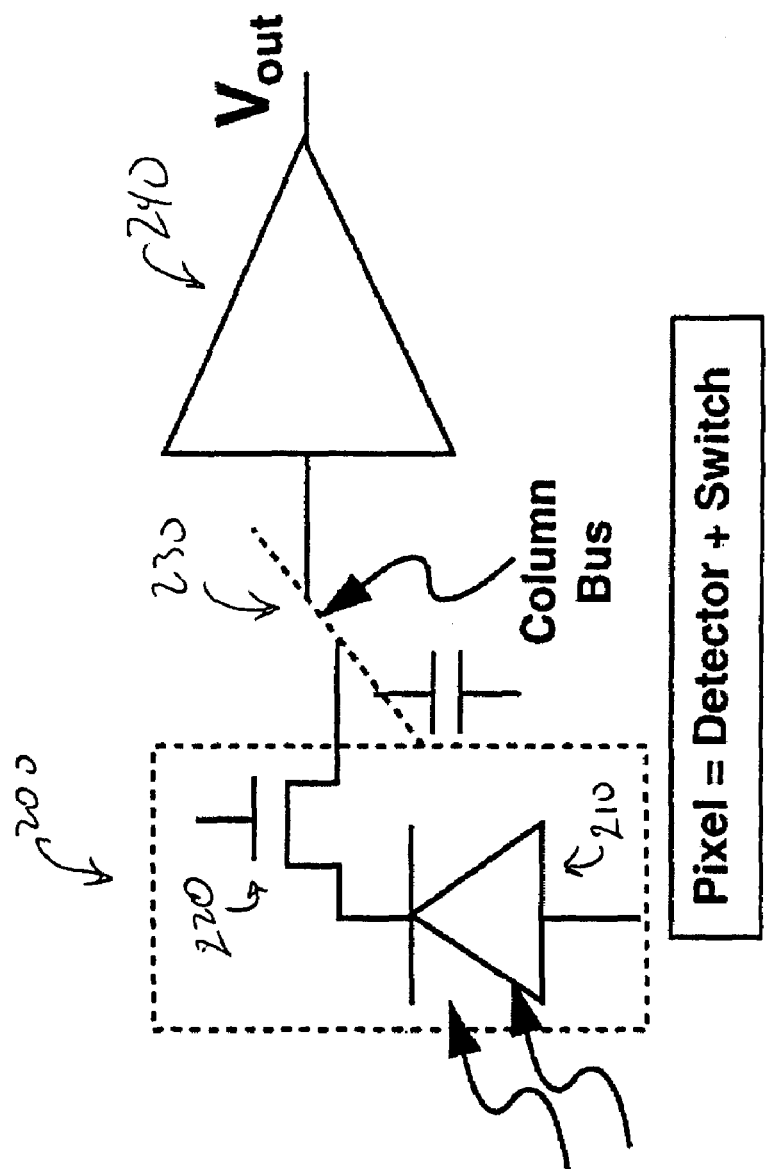
FIG. 2 is a block diagram of a conventional CMOS passive pixel sensor.

In a conventional CMOS passive pixel sensor (PPS) element as shown in FIG. 2, a pixel 200 contains two elements, a photodiode 210 and a switch transistor 220 connected to the output of the photodiode 210. Photons hitting the photodiode 210 produce an electrical charge which at the end of the integration time is passed by the switch transistor 220 to a column bus 230. The charge is passed to a common output amplifier logic circuit 240 to generate a video out ($V_{OUT}$) signal. The output amplifier 240 reads the pixel 200, converts the associated charge to a voltage signal, amplifies the resulting voltage signal, suppresses temporal noise, and cancels the support non-uniformity created by the output amplifier 240. Because the pixel 200 typically contains only the photodiode 210 and the switch transistor 220, the fraction of real estate in the pixel 200 which detects light (the "fill factor") is relatively large, typically 70 to 80%.

Figure 3:
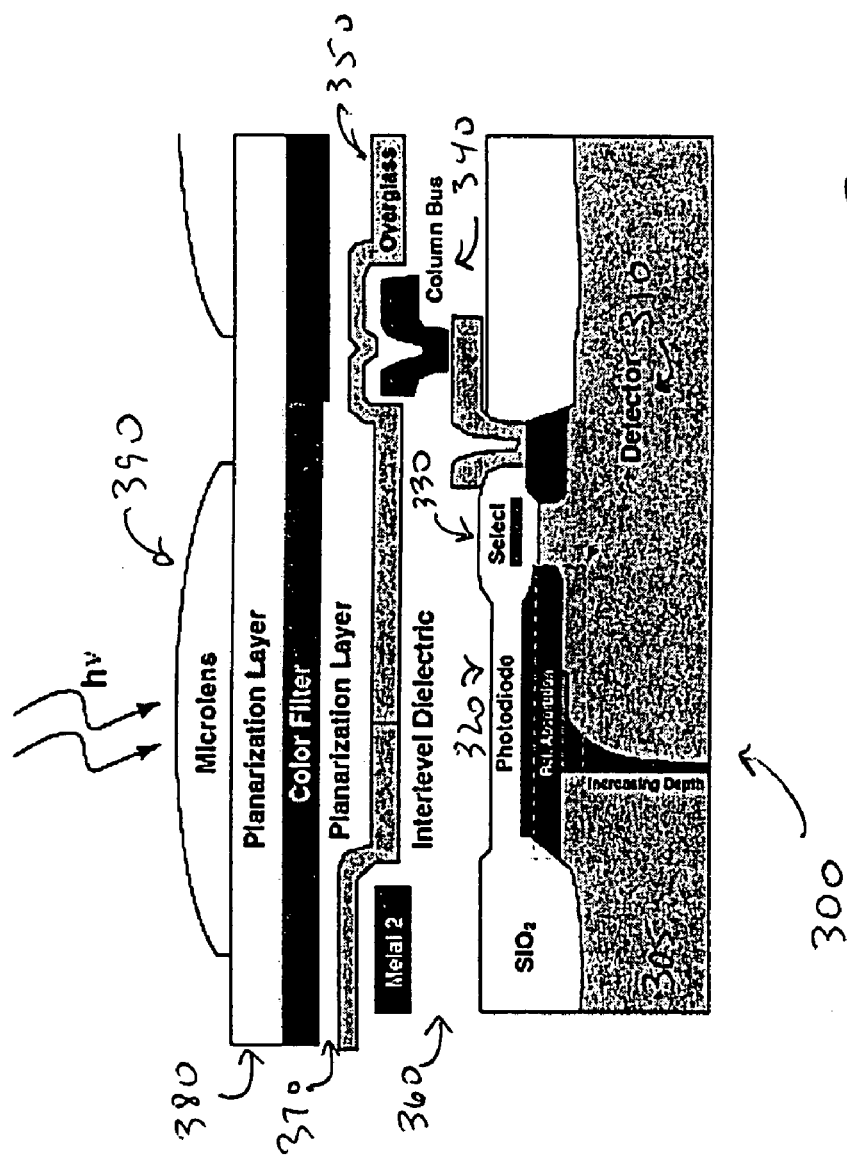
FIG. 3 is a cross sectional view of a conventional CMOS passive pixel sensor.

FIG. 3 is a cross-section of a typical PPS pixel 300. A photodiode 320 is formed on a detector area 310 on a substrate 305. A selection transistor 330 allows voltage to pass to a column bus connector 340, formed in an interlevel dielectric layer 360. An overglass layer 360 is formed on top of the dielectric layer 360 and the column bus connector 340. A planarization layer 370 provides a planar surface for a color filter layer and final planarization layer 380. A microlens 390 can be formed on the planarization layer 380 to further focus light onto the photodiode 320. Formation and use of these layers are generally understood in the art.

Figure 4:
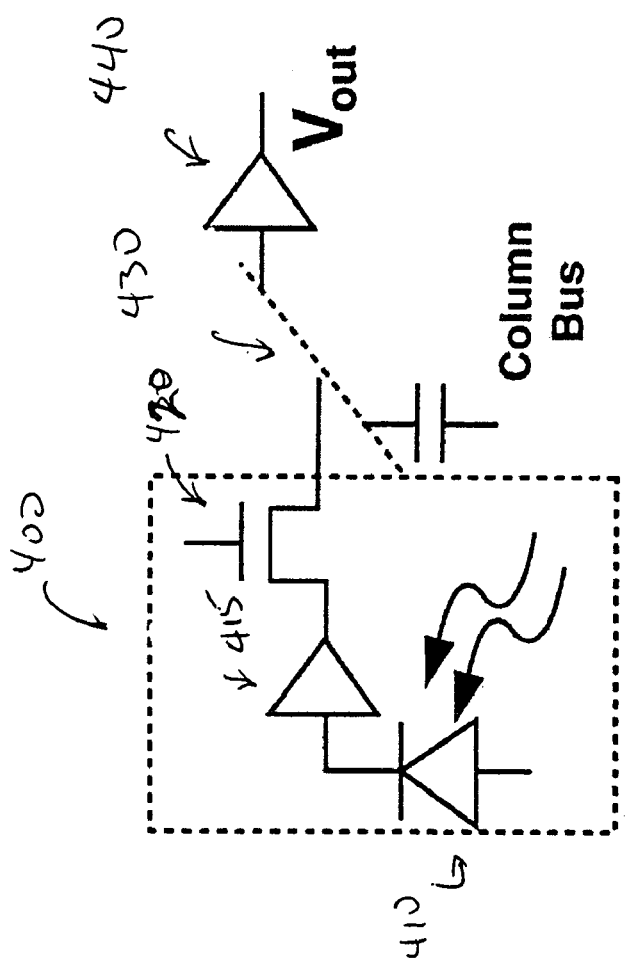
FIG. 4 is a block diagram of a conventional CMOS active pixel sensor.

Turning to FIG. 4, a conventional active pixel sensor (APS) 400 is shown. The APS pixel 400 contains a photodiode 410, a switch transistor 420 and an amplifier 415. The output of the switch transistor 420 is connected to a column bus 430 and an output amplifier logic 440. A photodiode 410, the switch transistor 420, and the column bus 430 are of like operation and structure as the corresponding elements of the PPS of FIG. 2. The amplifier 415 contained in the APS pixel 400 converts the photo-generated charge to a voltage inside the APS pixel 400, hence, the output amplifier logic 440 can be simpler in structure than the equivalent output amplifier 240 of the PPS pixel 200 of FIG. 2. While the amplifier 415 amplifies the resulting signal and reduces noise, the space required by the extra component reduces the fill factor considerably, typically to 20 to 30%. To counter the lower fill factor, APS imagers typically use microlenses as in FIG. 3, increasing the cost of the APS pixel 400, but typically multiplying the effective fill factor by a factor of 2 or 3.

Turning now to FIG. 5, a cross-section of an exemplary JFET/CMOS APS pixel 500 is shown. On a substrate 505, a CMOS integrated circuit including a junction field-effect transistor (JFET) is formed. The JFET provides both photodetection and electrical amplification of the signal corresponding to the number of photons detected, taking the place of the photodiode and separate transistor in a conventional APS pixel. A photodetection or absorption layer 510 is formed on the surface of the substrate 505. A source connector 520, a gate connector 530, and a drain connector 540 are formed in a next layer allowing electrical connection of the photodetection layer 530 to a metal layer 560. An overglass layer 550 is formed above the metal layer 560 of the APS pixel 500. The overglass layer 550 is capable of admitting photons to the photodetection layer 510. The JFET 500 detects incident photons admitted through the overglass layer 550 and produces an electrical signal corresponding to the number of photons detected. By using the JFET/CMOS APS pixel 500 for photodetection and electrical amplification, charge is not transferred out of the pixel, reducing temporal noise as is seen in conventional APS pixels. However, because a separate transistor is not needed for amplification, the fill factor of an APS pixel according to a disclosed embodiment is comparable to that of a PPS pixel, but with an improved signal to noise ratio because of the reduced temporal noise. In a disclosed embodiment, fill factors of 50 to 75% have been possible. One skilled in the art will recognize that improvements in CMOS fabrication techniques that reduce the size of the APS components can produce improvements in the fill factor without departing from the spirit of the invention. The use of the term JFET/CMOS structure should be understood to refer to a CMOS device with an integrated JFET.

JFETs formed in integrated circuits have physical properties such as gate width that affect electrical properties such as corner frequency and input refereed noise. JFET/CMOS devices can be made where the JFET has a corner frequency lower than a JFET formed in a N Metal Oxide Semiconductor (NMOS) circuit. One embodiment with two gates, each with a gate width of 15 $\mu$m for a total gate width of 30 $\mu$m, shows a corner frequency of 200 Hz, compared to an NMOS JFET with a 25 $\mu$m gate width which has a corner frequency of 100 kHz. Lowering the corner frequency is identical to reducing the 1/f noise. Because the integrated 1/f noise of the amplifier FET typically dominates for the FET geometries used in small pixels, the JFET/CMOS structure thus results in lower read noise. The JFET/CMOS structure thus allows the designer to trade a smaller JFET size for an even larger optical fill factor to increase the optical sensitivity relative to MOSFET-based APS designs while realizing equivalent read noise. This JFET/CMOS embodiment hence manifests higher imager signal-to-noise ratio. One skilled in the art will recognize that corner frequency depends on gate width and a larger device will usually have a higher corner frequency. Furthermore, a JFET/CMOS device can have an input referred noise—a noise value normalized by amplifier gain—of 20 dB lower than an NMOS JFET of the same size.

Figure 6:
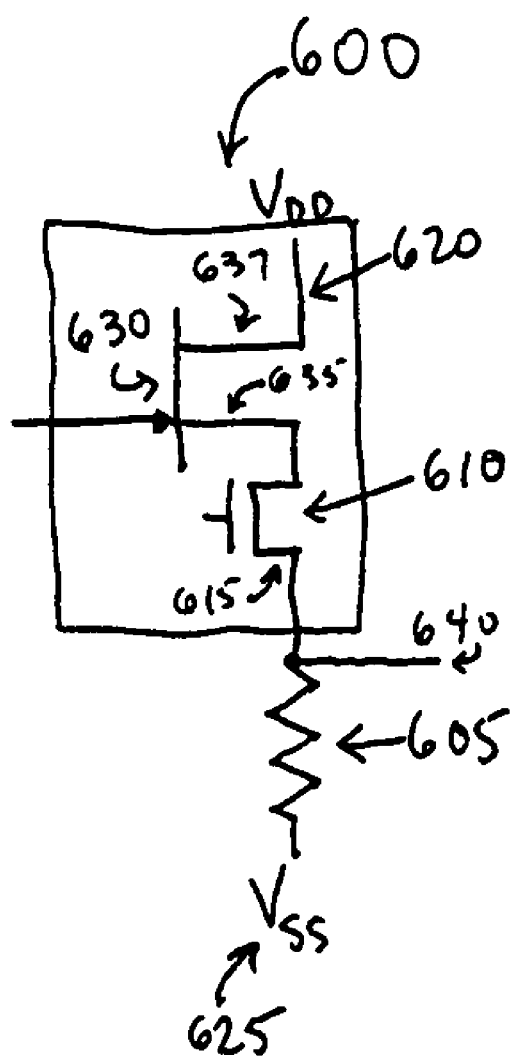
FIG. 6 is a circuit diagram of an exemplary JFET/CMOS active pixel with an integrated source follower configuration.
Figure 7:
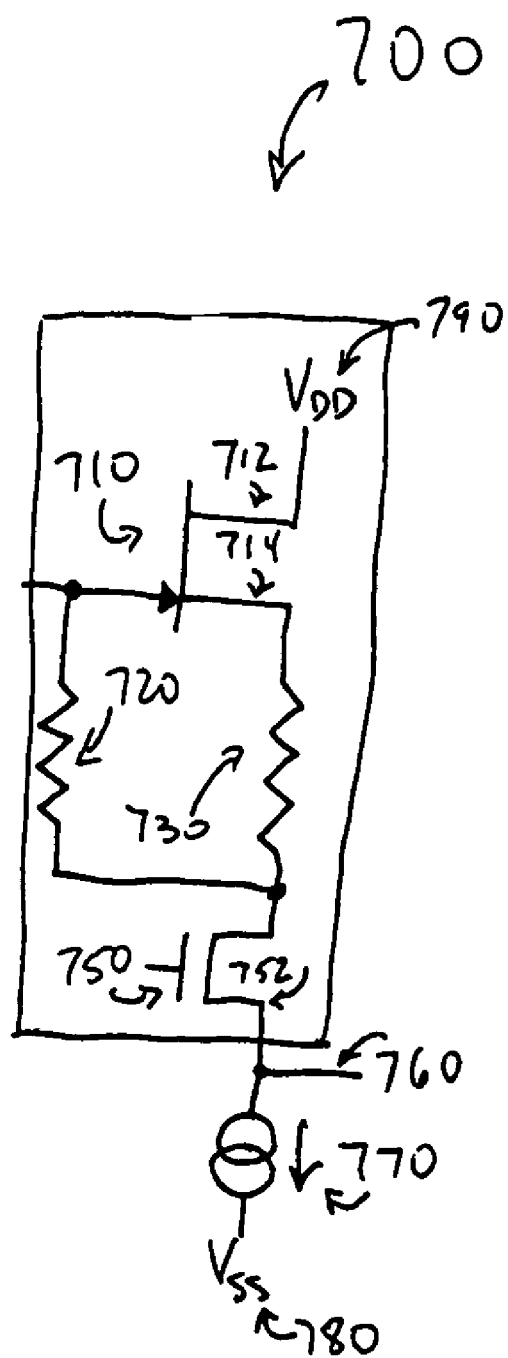
FIG. 7 is a circuit diagram of an exemplary JFET/CMOS active pixel configured with a source follower with positive feedback and laser trimmability.
Figure 8:
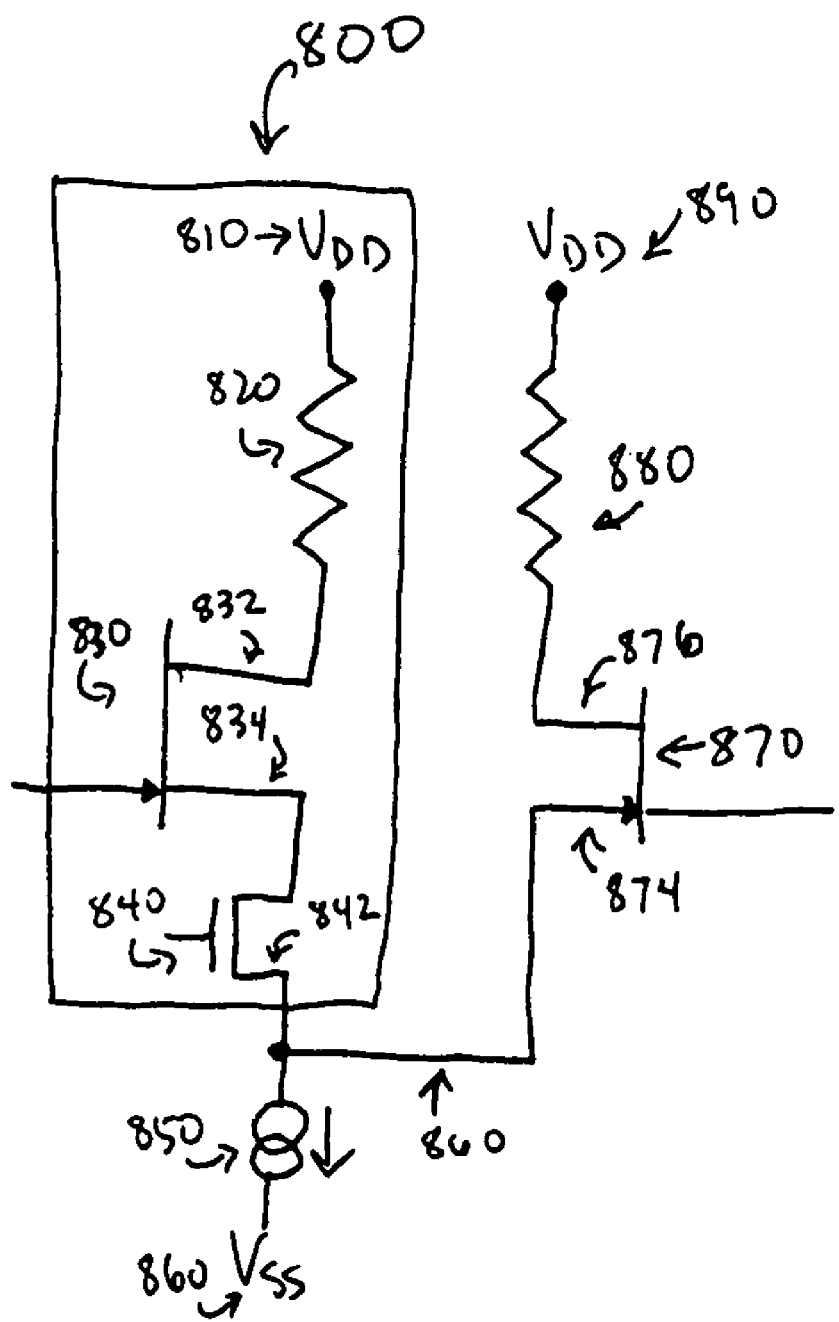
FIG. 8 is a circuit diagram of an exemplary JFET/CMOS active pixel with a differential amplifier configuration.

JFET/CMOS active pixels can be implemented in various types of amplifier circuits as shown in FIGS. 6–8. In each of FIGS. 6–8, a JFET provides photodetection and electrical amplification as described above. Note that the JFETs shown in FIGS. 6–8 are n-channel JFETs. While p-channel JFETs could also be used, such configuration requires either JFET integration in an n-well or the use of a p-well CMOS process. If an n-well is used, the well must be deeper than about 4 microns to allow absorption of near-infrared photons in the JFET rather than at the well-substrate junction.

In one disclosed circuit shown in FIG. 6, an APS pixel 600 is integrated with a source follower by connecting a resistor 605 and a bus 640 to a source terminal 615 of a readout switch transistor 610. A readout switch transistor 610 is connected to a source terminal 635 of a JFET 630 which serves as photodetector and amplifier. The readout switch transistor 610 allows switching the output of the pixel 600 to a column bus (not shown) where signals from multiple pixels are integrated to generate a video out signal. A drain voltage ($V_{DD}$) 620 is applied to a drain terminal 637 of the JFET 630. A source voltage ($V_{SS}$) 625 is applied to the resistor 605.

Another circuit, shown in FIG. 7, integrates a JFET/CMOS active pixel 700 with a source follower providing positive feedback and laser trimmability. As in FIG. 6, a drain voltage ($V_{DD}$) 790 is applied to a drain terminal 712 of the JFET 710. However, the pixel 700 includes resistors 720 and 730 which provide laser trimmability and positive feedback. Laser trimmability allows adjusting resistance in a circuit by use of a laser to remove material from a resistor, thereby increasing its resistance. A current source 770 and a source voltage ($V_{SS}$) 780 are attached to a bus 760 and a source terminal 752 of a readout switch transistor 750. The readout switch transistor 750 performs the same function as the readout switch transistor 610 of FIG. 6.

FIG. 8 shows a third embodiment integrating a JFET/CMOS active pixel 800 into a differential amplifier. Resistors 820 and 880 are connected to source terminals 832 and 876 of JFETs 830 and 870 respectively. A bus 860 is connected to a source terminal 842 of a readout switch transistor 840 as in FIGS. 6 and 7, but is also connected to a source terminal 874 of the JFET 870. As in FIG. 7, a current source 850 and a source voltage ($V_{SS}$) are also connected to the source terminal 842 of the switch transistor 840. As in FIGS. 6 and 7, the readout switch transistor 840 allows switching the output of the pixel 800 to a column bus (not shown) where signals from multiple pixels are integrated to generate a video out signal.

For each of the embodiments shown in FIGS. 6–8, a JFET is used in place of a photodiode used in typical CMOS imagers. One skilled in the art will recognize that these circuits are exemplary and illustrative and JFETs could be integrated into CMOS circuits in other ways without departing from the spirit of the invention.

Figure 9:
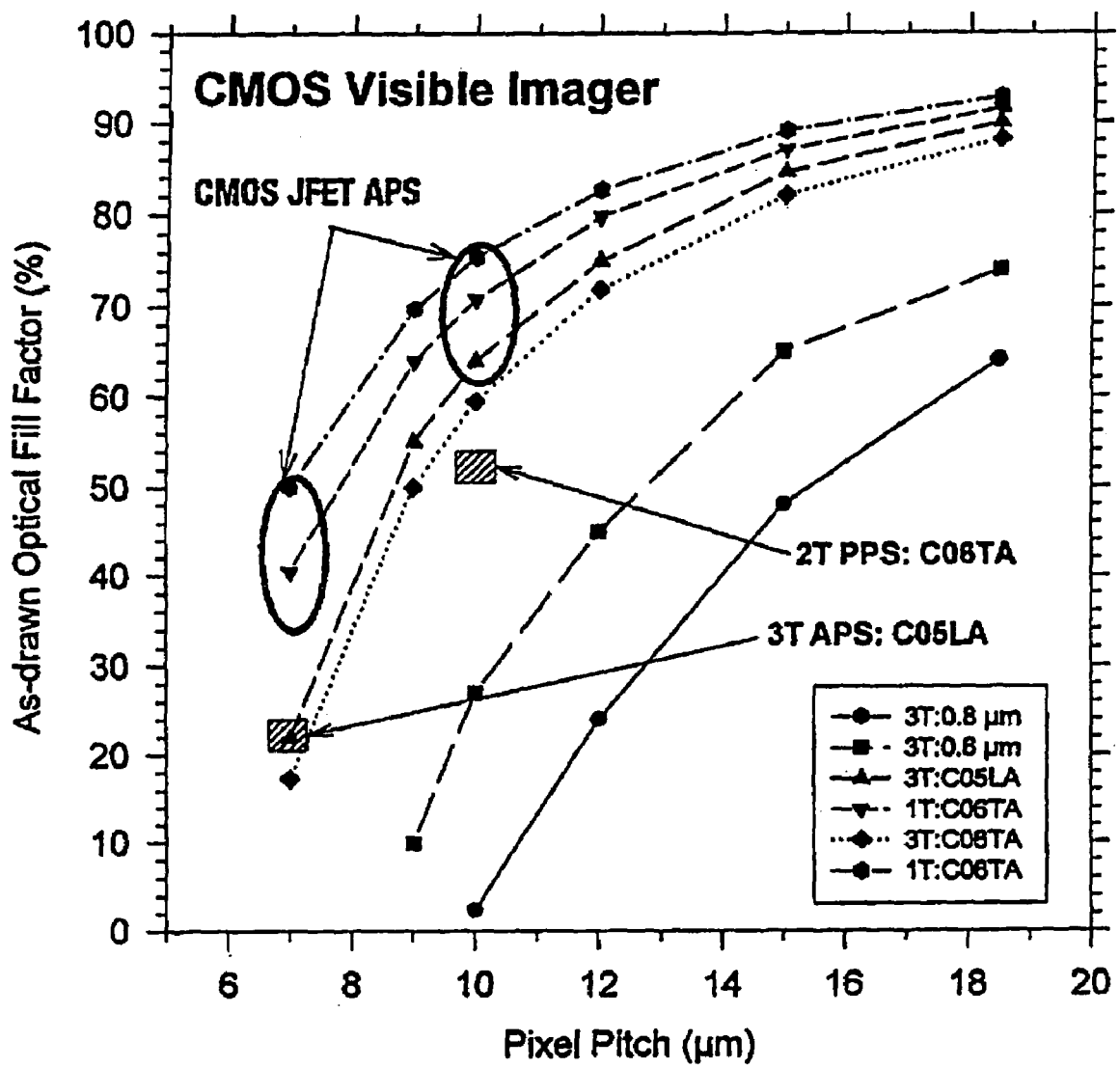
FIG. 9 is a graph showing fill factors and signal-to-noise ratios of JFET/CMOS active pixel sensors and conventional CMOS pixel sensor configurations.

Turning to FIG. 9, a graph showing fill factors on a vertical axis and pixel pitch on a horizontal axis for JFET/CMOS active pixel sensors and conventional CMOS active pixel sensors is shown. Pixel pitch is defined as the size of the pixel. As can be seen from the graph, a typical three transistor CMOS APS pixel C05LA has a fill factor of approximately 20% in a 7 micron APS pixel. In contrast, a JFET/CMOS APS pixel according to a disclosed embodiment has a fill factor in the 40 to 50% range for the same size pixel. Under some circumstances, a JFET/CMOS APS may even have a higher fill factor than a multi-transistor PPS pixel. For example, a standard two transistor PPS CMOS pixel C06TA (i.e., 0.6 $\mu$m CMOS technology with analog device modules) has a fill factor of approximately 50% in a 10 micron PPS pixel. However, a single transistor JFET/CMOS APS pixel of the same pixel pitch has a fill factor in the range of approximately 60 to 75%. One skilled in the art will recognize that these graphs are exemplary and illustrative and other fill factors are possible depending upon the circuit configuration of the APS or PPS pixels. Pixel pitch down to 7 μm is shown in FIG. 9 because minimum CMOS technology feature size down to 0.5 μm are compared to the corresponding JFET/CMOS technology. Sub-0.51 μm technology and the corresponding shrink in the minimum feature would allow a similar comparison and show a similar advantage at an even smaller pitch. 0.5 μm is used in this example because 0.5 μm technology is available at very low production cost and is therefore the current technology of choice for producing CMOS imagers.

Figure 10:
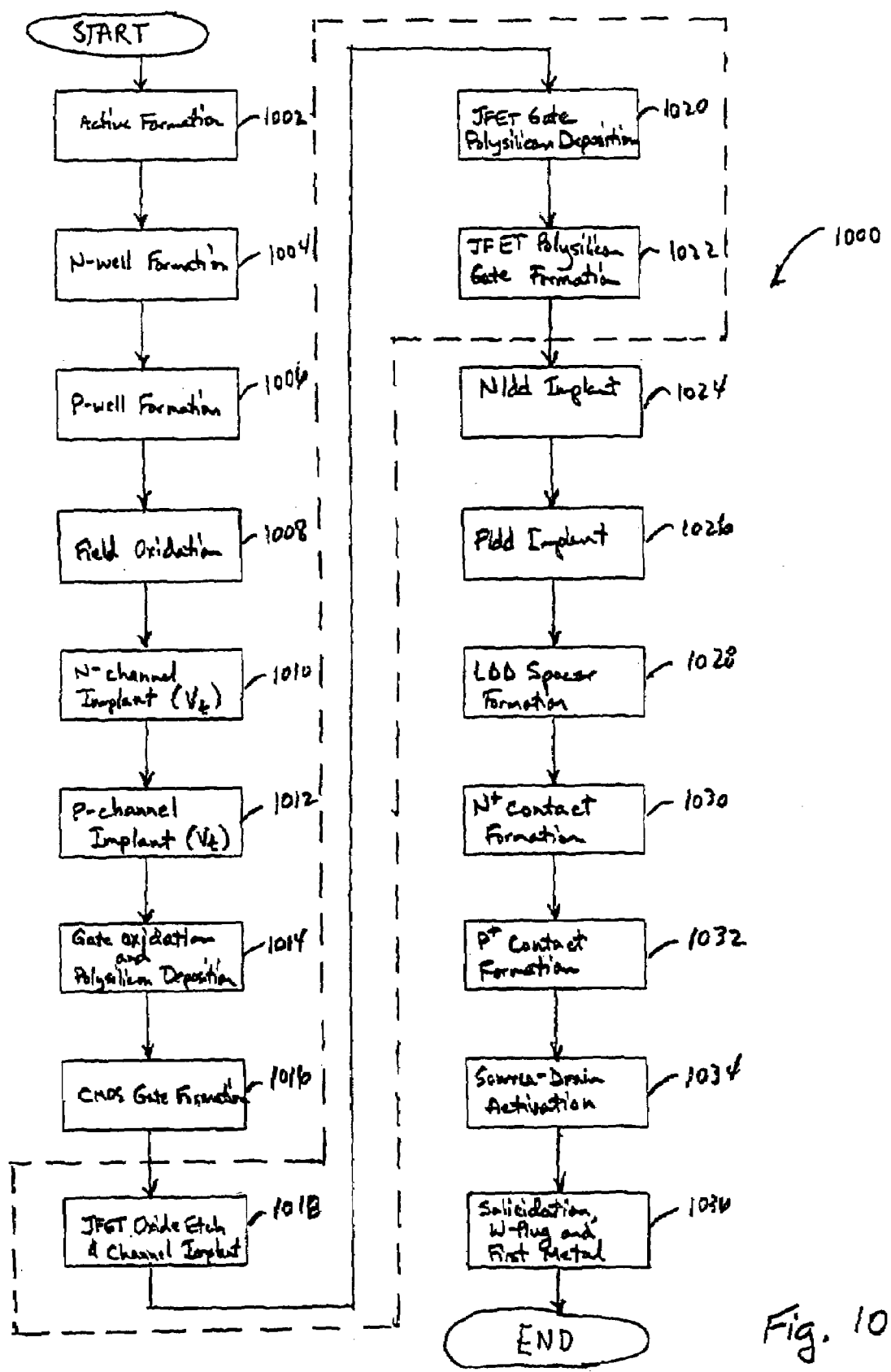
FIG. 10 is a flow chart showing an exemplary JFET/CMOS fabrication process in accordance with a JFET/CMOS active pixel sensor.

A technique of manufacture 1000 for the JFET/CMOS structure of FIGS. 5–9 is shown in FIG. 10. The manufacture process is commenced with a step 1002 of forming an active region on a silicon wafer substrate workpiece. This can be done by growing a layer of silicon dioxide over the entire surface of the water. On top of the oxide, a layer of silicon nitride ($Si_3N_4$) ("nitride") is deposited, typically using a chemical vapor deposition (CVD) technique. Then the nitride layer is coated with a layer of photoresist, typically by a spin-coating technique. Next, a light source such as a mercury vapor lamp or an ultraviolet excimer laser illuminates the wafer through an interposed mask to remove the photoresist material in the desired active regions. Then, the exposed sections of the nitride layer are etched by immersion in a hydrofluoric acid (HF) solution. In a step 1004, an n-well is formed on the workpiece to a desired depth. The n-well is formed by using an ion implanter to accelerate a dopant of charged ions (typically phosphorous) into the surface of the wafer. The ions go through the exposed oxide layer, but stick in the photoresist/nitride layer, creating the n-well. A p-well is next formed to a desired depth in a step 1006 using similar techniques. Field oxidation is then performed in a step 1008: the remaining photoresist material is removed, then a thicker oxide layer is deposited over the n-well region. The nitride layer prevents oxide growth on undesired areas of the wafer. After the field oxidation of step 1008, successive steps of N-channel implantation 1010 and P-channel implantation 1012 are performed with materials that provide a desired threshold voltage (VT) in the active region. The remaining nitride layer is removed, and implantation with a dopart of $BF_2$ or other suitable material adjusts the $V_T$. The thick oxide layer prevents the implantation from affecting the n-well region. Thereafter, a step 1014 of gate oxidation and polysilicon deposition is performed. All of the oxide is removed, and a new thin layer of oxide is grown, followed by a nitride layer. The oxide layer is used to prevent thermal expansion problems that would be caused of the nitride layer were directly deposited on the silicon wafer.

Again, active regions are formed by patterning the nitride (covering with photoresist, exposing, developing, etching, and removing the remaining photoresist) to make areas for building transistors. Then a high-pressure oxidation grows thick oxide wherever the nitride was removed. Next, the nitride is removed and enough oxide is removed to remove all of the oxide under the nitride regions. Then the entire wafer is covered with a polysilicon layer. In a step 1016, the CMOS gate is formed in an active region. The polysilicon is patterned to form the two regions that will be the gates of the CMOS structure. The wafer is again covered with photoresist. The photoresist is removed over the region of the n-channel CMOS device, but left covering the p-channel device. (CMOS structures inherently have both n-channel and p-channel devices, hence the "complementary".) A little area near the edge of the n-well is also left uncovered to allow implantation for making a contact later.

Steps 1002–1016 are conventional steps for forming a CMOS structure. Once the foregoing processing steps are completed, the technique 1000 includes several intermediate steps for forming the JFET of the CMOS device. In a step 1018, a JFET oxide etch and channel implant is performed. Specifically in the step 1018, an oxide layer is deposited, followed by an oxide etch, and finally channel and punch-thru implantation is completed. The punch-thru implantation stops a short channel effect where the gate is very small. The technique 1000 further includes a JFET gate polysilicon deposition step 1020. In the step 1020, a polysilicon layer is deposited, $BF_2$ is implanted, and a nitride layer is deposited. A final JFET intermediate step of the technique 1000 is a JFET polysilicon gate formation step 1022. In the step 1022, a nitride etch is performed, followed by a polysilicon etch. Steps 1018–1022 are typical of a JFET formation process. In accordance with the disclosed technique, the JFET formation process is applied to a JFET integrated into a CMOS device. One advantage of a JFET/CMOS structure is the low noise characteristics of a JFET. One application of such a JFET/CMOS structure is an imager. Steps 1018–1022 can be performed using a single mask. By performing these steps using a single mask, production cost is minimized and process uniformity is maximized.

After the foregoing intermediate steps, the technique 1000 proceeds with additional conventional CMOS process steps. In particular, an N-lightly doped drain (Nldd) implant is performed in a step 1024. The step 1024 is followed by a P-lightly doped drain (Pldd) implant step 1026. The wafer is exposed to phosphorous ions in the implanter. The polysilicon gate, field oxide, and photoresist block implantation, so n-type regions in the p-type substrate are formed, as well as n-channel Metal Oxide Semiconductor (MOS) source/drain regions. The photoresist is then stripped, and new photoresist is applied and patterned for a boron p-type implant. A step 1028 next forms a spacer in a lightly doped drain (LDD) spacer formation procedure. In a step 1030, an n+ contact is formed. A p+ contact is formed in a step 1032. All of the photoresist is removed, and another oxide layer is deposited over the surface. Photoresist is again placed over the entire wafer and patterning for contact holes is created through the oxide. Contact holes for the drains and sources are created, making sure the holes are big enough to connect the source contact to either the p-substrate or the n-well as appropriate. Source-drain activation for the CMOS gates next occurs in a step 1034. The step 1032 includes activation and removal of the JFET nitride layer. Finally, a step 1036 includes salicidation, W-plug and first metal procedures. A sputtering mechanism can be used to coat the entire surface with a conductor. Another photoresist, patterning, and etching step is done to remove the conductor. Aluminum can be used as the conductor. Solicidation is used to lower resistance and makes creation of a tungsten (W) plug connector easier. One skilled in the art will recognize that additional metal layers above the first metal layer can be formed as required for the circuit. CMOS fabrication has typically only involved steps 1002–1016 and steps 1024–1036. The JFET formation steps 1018–1022 are not generally performed in standard CMOS processes and are therefore not "standard." Incorporation of the JFET therefore involves significant investments, including characterization of the resulting JFETs and the influence of such steps on the standard CMOS devices.

The disclosed embodiments are not exhaustive and are only exemplary for CMOS chips, imagers, and processes. The particular structure and connections in a particular embodiment may depend upon the particular implementation and the included devices and resources. Although a system and method according to the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A complementary metal oxide semiconductor (CMOS) device comprising:
   a silicon substrate;
   a junction field-effect transistor (JFET) formed on a surface of the silicon substrate, the JFET including a photo-absorbing layer formed on the surface of the silicon substrate;
   an overglass layer formed over the JFET adapted to admit photons to the photo-absorbing layer of the JFET; and
   a readout switch transistor formed to be coupled to a drain terminal of the JFET;
   wherein the JFET detects incident photons admitted through the overglass layer and produces an amplified electrical signal corresponding to the photons detected, and wherein a source terminal of the readout switch transistor is connected to a bus and a resistor, forming a source follower circuit.

2. The CMOS device as in claim 1, wherein the JFET provides a relatively low corner frequency.

3. The CMOS device as in claim 1, wherein an input referred noise of the JFET is relatively low.

4. A complementary metal oxide semiconductor (CMOS) active pixel sensor (APS) pixel supported on a substrate, the CMOS APS pixel comprising:
   a junction field-effect transistor (JFET) adapted to detect photons and produce an amplified electrical signal corresponding to the photons detected; and
   a readout switch transistor coupled to a drain terminal of the JFET;
   wherein a source terminal of the readout switch transistor is connected to a bus and a resistor, forming a source follower circuit.

5. A complementary metal oxide semiconductor (CMOS) active pixel sensor (APS) pixel supported on a substrate, the CMOS APS pixel comprising:
   a junction field-effect transistor (JFET) adapted to detect photons and produce an amplified electrical signal corresponding to the photons detected;
   a readout switch transistor coupled to a drain terminal of the JFET;
   a first resistor connected between a gate terminal of the JFET and a drain terminal of the readout switch transistor;
   a second resistor connected between a source terminal of the JFET and the drain terminal of the readout switch transistor, wherein the first and second resistors provide positive feedback and laser trimmability, and
   wherein a source terminal of the readout switch transistor is connected to a bus and a current source, forming a source follower.

6. The CMOS APS pixel as in claim 4, wherein the JFET is contained in a differential amplifier circuit.

7. A digital camera comprising:
   a complementary metal oxide semiconductor (CMOS) active pixel sensor (APS) imager providing image data, the imager comprising:
   an array of CMOS APS pixels comprising a plurality of junction field-effect transistors (JFETs) adapted for photodetection and electrical signal amplification; and
   a readout switch transistor coupled to a drain terminal of the JFET;
   wherein a source terminal of the readout switch transistor is connected to a bus and a resistor, forming a source follower circuit.

8. The digital camera as in claim 7, the array of CMOS APS pixels comprising:
   a silicon substrate;
   a JFET formed on the surface of the silicon substrate comprising:
     a photo absorbing layer formed on the surface of the silicon substrate;
     an overglass layer formed over the JFET adapted to admit photons to the photo-absorbing layer of the JFET
   wherein the JFET detects incident photons admitted through the overglass layer and produces an amplified electrical signal corresponding to the photons detected.

9. The digital camera as in claim 7, wherein each JFET of the plurality of JFETs is contained in a differential amplifier circuit.

* * * * *